United States Patent
Momtaz

(10) Patent No.: US 7,750,707 B2
(45) Date of Patent: Jul. 6, 2010

(54) HIGH-RESOLUTION LOW-INTERCONNECT PHASE ROTATOR

(75) Inventor: Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 36 days.

(21) Appl. No.: 12/049,677

(22) Filed: Mar. 17, 2008

(65) Prior Publication Data

US 2009/0231009 A1 Sep. 17, 2009

(51) Int. Cl.
*H03H 11/16* (2006.01)
(52) U.S. Cl. .................. 327/237; 327/231; 327/276; 327/291; 375/283
(58) Field of Classification Search .................. 327/231, 327/233–235, 237, 238, 240–241, 254–259, 327/291, 295, 296, 298, 299; 375/283, 330
See application file for complete search history.

(56) References Cited

U.S. PATENT DOCUMENTS

| | | | | |
|---|---|---|---|---|
| 7,298,195 | B2 * | 11/2007 | Freyman et al. | 327/247 |
| 7,579,891 | B2 * | 8/2009 | Ebner | 327/237 |
| 2005/0017780 | A1 * | 1/2005 | Baba | 327/276 |
| 2009/0195286 | A1 * | 8/2009 | Rylov | 327/237 |

OTHER PUBLICATIONS

Bulzacchelli et al., "A 10-Gb/s 5-Tap DFEt4-Tap FFE Transceiver in 90-nm CMOS Technology", IEEE Journal of Solid-State Circuits, vol. 41, No. 12, Dec. 2006, pp. 2885-2900.*

* cited by examiner

*Primary Examiner*—Lincoln Donovan
*Assistant Examiner*—Shikha Goyal
(74) *Attorney, Agent, or Firm*—Garlick Harrison & Markison; Shayne X. Short

(57) ABSTRACT

High-resolution low-interconnect phase rotator. A signal may be generated having any desired phase (as determined by the step size employed). First and second control signals select a sector (e.g., the range from 0° to 360° is divided into a number of sectors) and a particular phase within that sector. Generally, this range from 0° to 360° is uniformly divided so that each sector is the same. However, if desired, there can alternatively be differences in the sizes of each of the sectors. The use of these two sets of controls signals (one for selecting the sector and one for selecting the particular phase within the sector) allows for very few control signals. N-channel metal oxide semiconductor field-effect transistor (N-MOSFET) based switches and differential pairs of transistors or alternatively p-channel metal oxide semiconductor field-effect transistor (P-MOSFET) based switches and differential pairs of transistors can be employed.

20 Claims, 10 Drawing Sheets

HIGH-RESOLUTION LOW-INTERCONNECT PHASE ROTATOR

BACKGROUND OF THE INVENTION

1. Technical Field of the Invention

The invention relates generally to communication systems; and, more particularly, it relates to phase rotation of signals within such communication systems.

2. Description of Related Art

Data communication systems have been under continual development for many years. Sometimes within such communication systems, there is a need to perform rotation of signals (e.g., by changing the phase of such signals). For example, within a wide variety of applications (e.g., serializers, de-serializers, and/or other communication devices, etc.), there may be a need to generate a signal having a desired phase.

Traditional, prior art embodiments of N step phase rotators employ control signals including N bits. As N or the number of required phase rotators increases, the necessary control signal routing and congestion also increases. As this number increases, the digital to analog (D/A) interfacing becomes a challenging design issue.

FIG. 2 illustrates an embodiment of a prior art apparatus 200 implemented to perform phase rotation. In this embodiment, clock signals are provided to 4 different differential pairs of transistors, as shown by differential pair 0°, differential pair 90°, differential pair 180°, and differential pair 270°.

A very large control word (e.g., 256 bits in this embodiment) is employed to control the connectivity of 256 corresponding switches. In this embodiment, 64 separate current sources and/or supplies (shown as Io-1 to Io-64), and each current supply is coupled to ends of 4 of the switches.

The switches are arranged in groups of 4, such that current from any one current supply is only directed through one of the switches in each group of 4 to only one of the differential pairs of transistors. As can be seen, this prior art approach includes a significant number of control signals (e.g., 256 in this embodiment), and this can consequently lead to significant congestion and consumptive of real estate within this prior art approach.

Because of the very large number of control signals within the prior art apparatus 200 and this prior art approach, congestion and routing clearly become significantly complex design issues. Alternatively, considering the 256 control signal prior art embodiment as an illustration, to avoid this issue of such a very large number of control signals, sometimes a decoder is employed that receives 7 separate signals and then decodes those 7 signals to generate the 256 control signals. However, this decoder implementation can sometimes create glitches within the 256 control signals. To address the glitch problems, a number of flip-flops (FFs) can be added, but the FFs do add some latency to the overall architecture. If latency is not a concern, then the FF approach adequately deals with the glitch problems. However, generally speaking, increasing and/or changing the latency of an overall data recovery loop is undesirable. Also generally speaking, smaller data recovery loop latency is desirable.

FIG. 3 illustrates an alternative embodiment of a prior art apparatus 300 implemented to perform phase rotation. This embodiment 300 is analogous to the previous embodiment, and this embodiment shows the connectivity of the differential pairs of transistors and how the various clock signals are provided to their respective gates. For example, a first clock signal having a phase of 0° is provided to differential pair 0°, a second clock signal having a phase of 90° is provided to differential pair 90°, a third clock signal having a phase of 180° is provided to differential pair 180°, and a fourth clock signal having a phase of 270° is provided to differential pair 270°.

The sources of each differential pair are coupled together and that node is also coupled to one switch within each of the groups of 4 switches. For example, the sources of the differential pair 0° are coupled together and that node is coupled to the switches controlled by ctrl1, ctrl5, and so on up to ctrl253, respectively. The sources of the differential pair 90° are coupled together and that node is coupled to the switches controlled by ctrl2, ctrl6, and so on up to ctrl254, respectively.

The sources of the differential pair 180° are coupled together and that node is coupled to the switches controlled by ctrl3, ctrl7, and so on up to ctrl255, respectively. The sources of the differential pair 270° are coupled together and that node is coupled to the switches controlled by ctrl4, ctrl8, and so on up to ctrl256, respectively.

When crtl1 closes its corresponding switch, then the other of the control signals that control that group of 4 switches will keep those other 3 switches open (e.g., crtl2, crtl3, and crtl4 keep their corresponding switches open), and current from current source Io-1 is directed to the sources of the differential pair 0°.

When crtl2 closes its corresponding switch, then the other of the control signals that control that group of 4 switches will keep those other 3 switches open (e.g., crtl1, crtl3, and crtl4 keep their corresponding switches open), and current from current source Io-1 is directed to the sources of the differential pair 90°.

If all current from all of the current sources Io-1 to Io-64 is directed to the differential pair 0°, then the output signal (shown as outn/outp) has a phase of 0°. If all current from all of the current sources Io-1 to Io-64 is directed to the differential pair 90°, then the output signal (shown as outn/outp) has a phase of 90°.

If all current from all of the current sources Io-1 to Io-64 is directed to the differential pair 180°, then the output signal (shown as outn/outp) has a phase of 180°. If all current from all of the current sources Io-1 to Io-64 is directed to the differential pair 270°, then the output signal (shown as outn/outp) has a phase of 270°.

If the current from one half of the current sources (e.g., Io-1 to Io-32) is directed to the differential pair 0°, and the current from one half of the current sources (e.g., Io-33 to Io-64) is directed to the differential pair 90°, then the output signal (shown as outn/outp) has a phase of 45°.

Also, if three fourths of the current sources (e.g., Io-1 to Io-16) is directed to the differential pair 0°, and the current from one fourth of the current sources (e.g., Io-17 to Io-64) is directed to the differential pair 90°, then the output signal (shown as outn/outp) has a phase of 22.5°.

By directing the current from the current sources (e.g., Io-1 to Io-64) to two different differential pairs of transistors in a particular manner, then a signal having any desired phase (as controlled by the limits of the step size of the device) in between the phases of the clock signals provided to those two different differential pairs of transistors can be generated and output via the selectively coupled drains of the differential pairs of transistors (as shown by outn/outp).

As can also be seen in this embodiment, load impedances (e.g., resistors) may be coupled between the selectively coupled drains of the differential pairs of transistors to a power supply voltage (e.g., VDD or VSS).

FIG. 4 illustrates an alternative embodiment of a prior art apparatus 400 implemented to perform phase rotation. This embodiment is analogous to the previous embodiments, but this embodiment employs 8 differential pairs of transistors. For example, 8 different clock signals are provided to the 8 differential pairs of transistors. A clock signal having a phase of 0° is provided to differential pair 0°, a clock signal having a phase of 45° is provided to differential pair 45°, a clock signal having a phase of 90° is provided to differential pair 90°, a clock signal having a phase of 135° is provided to differential pair 135°, a clock signal having a phase of 180° is provided to differential pair 180°, a clock signal having a phase of 225° is provided to differential pair 225°, a clock signal having a phase of 270° is provided to differential pair 270°, and a clock signal having a phase of 315° is provided to differential pair 315°.

This embodiment also includes a very large control word (e.g., 256 bits in this embodiment) is employed to control the connectivity of 256 corresponding switches. In this embodiment, 32 separate current sources and/or supplies (shown as Io-1 to Io-32), and each current supply is coupled to ends of 8 of the switches. The switches are arranged in groups of 8, such that current from any one current supply is only directed through one of the switches in each group of 8 to only one of the differential pairs of transistors. As can be seen, this prior art approach includes a significant number of control signals (e.g., 256 in this embodiment), and this can consequently lead to significant congestion and consumptive of real estate within this prior art approach.

As can be seen within these prior art approaches, there is a great deal of control signaling and routing therein. There exists a need in the art a better means by which phase rotators may be implemented.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

A novel approach is presented herein by which a signal may be generated having any desired phase (as determined by the step size employed in the particular embodiment).

Instead of employing a very large number of control signals as typically employed within the prior art, switches are implemented in a way such that a significantly reduced number of control signals may be used. These control signals may be viewed as being partitioned into two groups, and each group of control signal is provided to a corresponding group of switches. One of the groups of switches and control signal selects a sector (e.g., the range from 0° to 360° is divided into a number of sectors, and each sector includes a sub-range of phases such as phases from 0° to 90°, phases 90° to 180°, etc.).

The entire range of possible phases (e.g., between 0° to 360°) may be viewed as being sub-divided into a number of sectors. These sectors are generally distinct from one another, in that, the only overlap between two adjacent sectors could be the adjoining/common boundary of those two adjacent. Each sector includes a distinct number of possible phases between that sector's uppermost phase and that sector's lowermost phase, inclusive.

Generally, this range from 0° to 360° is uniformly divided so that each sector is the same. However, if desired, there can alternatively be differences in the sizes of each of the sectors.

Considering an example, if the range from 0° to 360° is uniformly divided into 4 sectors or 4 quadrants, then a first sector includes phases between that sector's uppermost phase (90°) and that sector's lowermost phase (0°), inclusive. A second sector includes phases between that sector's uppermost phase (180°) and that sector's lowermost phase (90°), inclusive, and so on. As can be seen, the boundary phase of 90° could be viewed as being in both of the sectors.

Considering another example, if the range from 0° to 360° is uniformly divided into 8 sectors, then a first sector includes phases between that sector's uppermost phase (45°) and that sector's lowermost phase (0°), inclusive. A second sector includes phases between that sector's uppermost phase (90°) and that sector's lowermost phase (0°), inclusive, and so on. As can be seen, the boundary phase of 45° could be viewed as being in both of the sectors.

If desired, these boundaries between adjacent sectors can be assigned to correspond to only one of the adjacent sectors.

Figure 1:
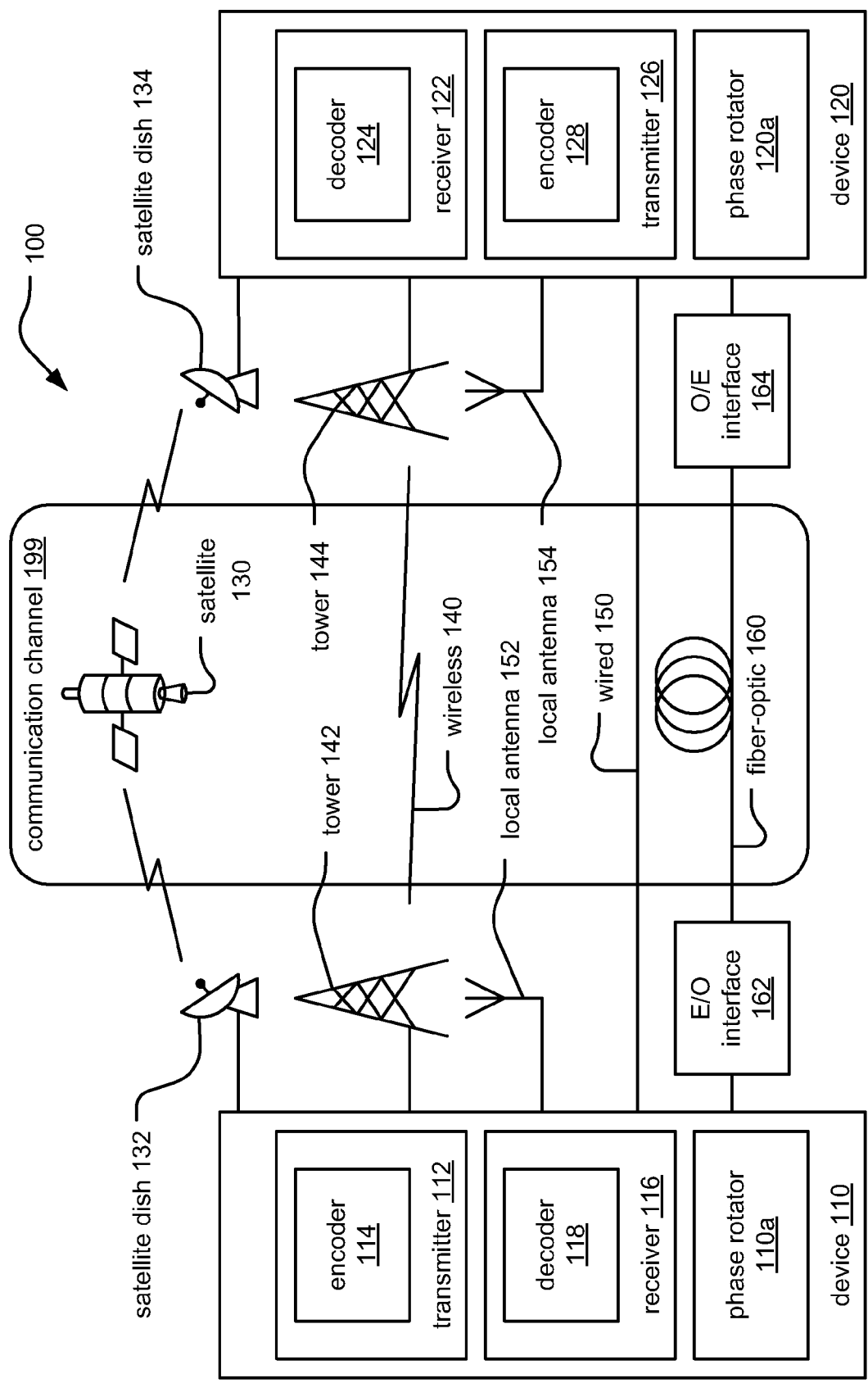
FIG. 1 illustrates an embodiment of a communication system.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber (e.g., optical fiber), copper, and/or other types of media as well.

FIG. 1 is a diagram illustrating an embodiment of a communication system 100.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)).

In addition, more than one type of media may be implemented and interfaced together thereby forming the communication channel 199. It is noted also that either one of both of the communication device 110 and the communication device 120 can include a hard disk drive (HDD) (or be coupled to a HDD).

Moreover, either one of both of the communication device 110 and the communication device 120 can include a phase rotator implemented to generate a signal having a particular or desired phase. For example, the communication device 110 can include a phase rotator 110a, and the communication device 120 can include a phase rotator 120a.

The signals employed within this embodiment of a communication system 100 can be of any variety of types of signals, including uncoded signals, Reed-Solomon (RS) coded signals, LDPC (Low Density Parity Check) coded signal, turbo coded signals, turbo trellis coded modulation (TTCM), or coded signal generated using some other error correction coding (ECC).

Also, any of a very wide variety of applications that perform transferring of signals from one location to another (e.g., including from a first location to a HDD, or from the HDD to another location) can benefit from various aspects of the invention, including any of those types of communication devices and/or communication systems depicted in FIG. 1. Moreover, any other types of devices, methods, and applications that employ phase rotated signals can also benefit from various aspects of the invention.

Such a phase rotator 110a or a phase rotator 120a, or any embodiment of a phase rotator in accordance with certain aspects described herein, can be implemented anywhere within a device where a signal having a particular phase is employed. For example, in some applications, many instantiations of an element are operated in parallel (e.g., an array of analog to digital converters (ADCs)). It may be desirable to ensure that all of these ADCs operate synchronously with one another. In such a case, one or more phase rotators could be employed to ensure that signals being provided to the parallel-implemented ADCs are all in phase with one another. A number of parallel-implemented phase rotators could process those signals (e.g., being sampled by the ADCs) to ensure that they are all in proper phase with one another.

Another application may include a device that performs serialization and/or de-serialization, multiplexing and/or de-multiplexing in which multiple signals need to be processed together and it is desirable that they are all in phase with one another. Again, a number of parallel-implemented phase rotators could process those signals (e.g., undergoing serialization and/or de-serialization, multiplexing and/or de-multiplexing) to ensure that they are all in proper phase with one another.

Generally speaking, such a phase rotator can be employed within any device in which a signal having a particular phase is desired.

Figure 2:
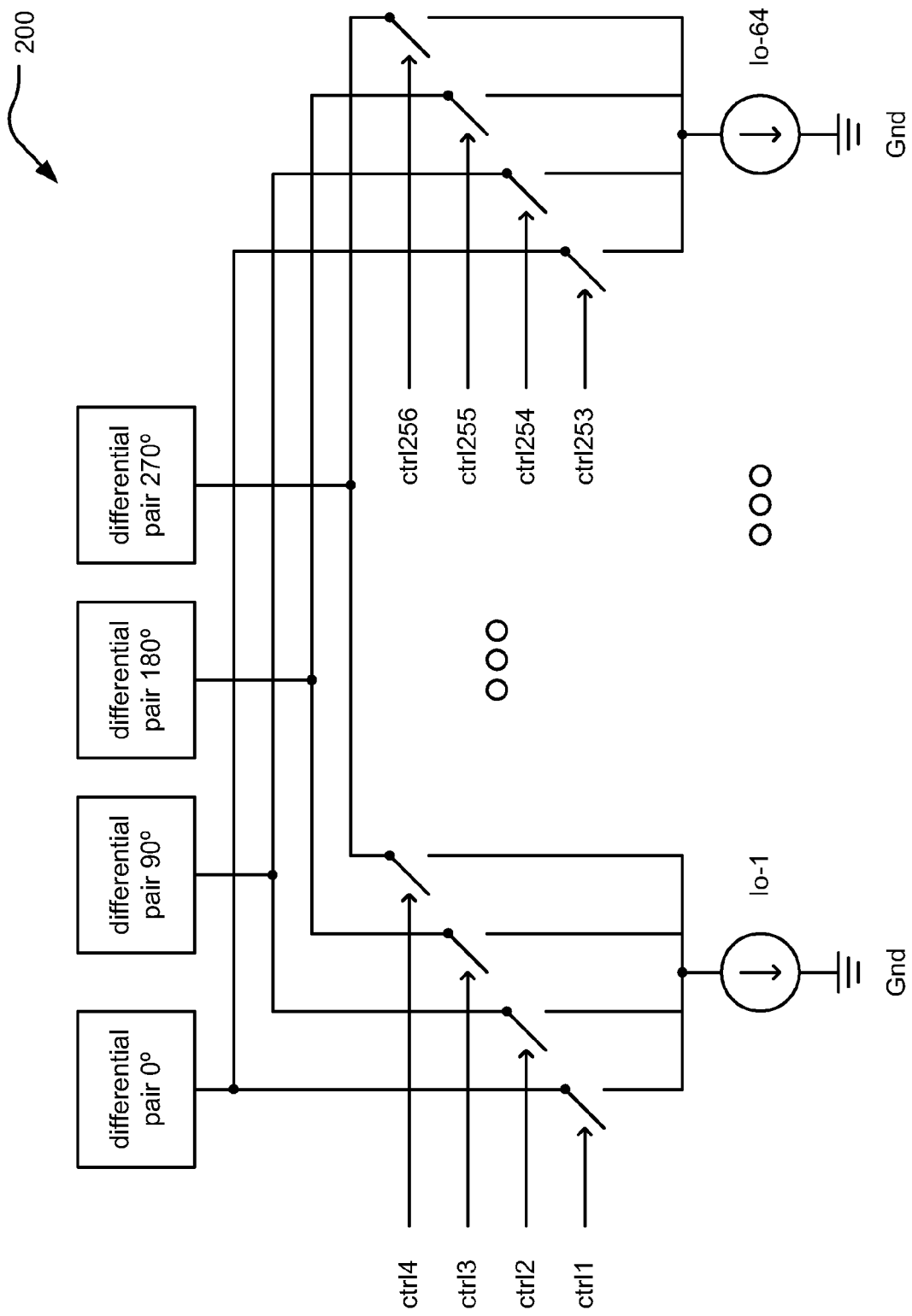
FIG. 2 illustrates an embodiment of a prior art apparatus implemented to perform phase rotation.
Figure 3:
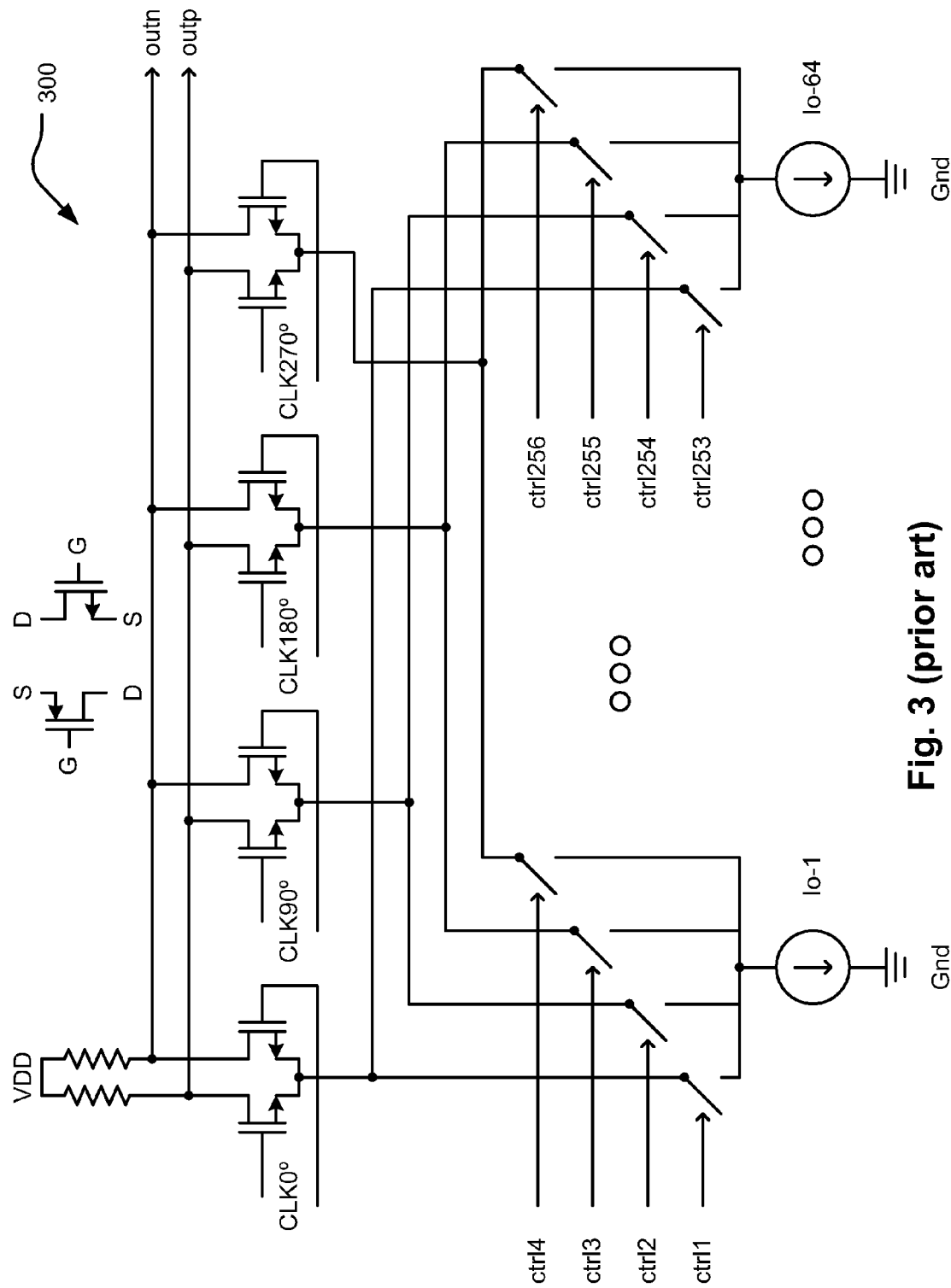
FIG. 3 illustrates an alternative embodiment of a prior art apparatus implemented to perform phase rotation.
Figure 4:
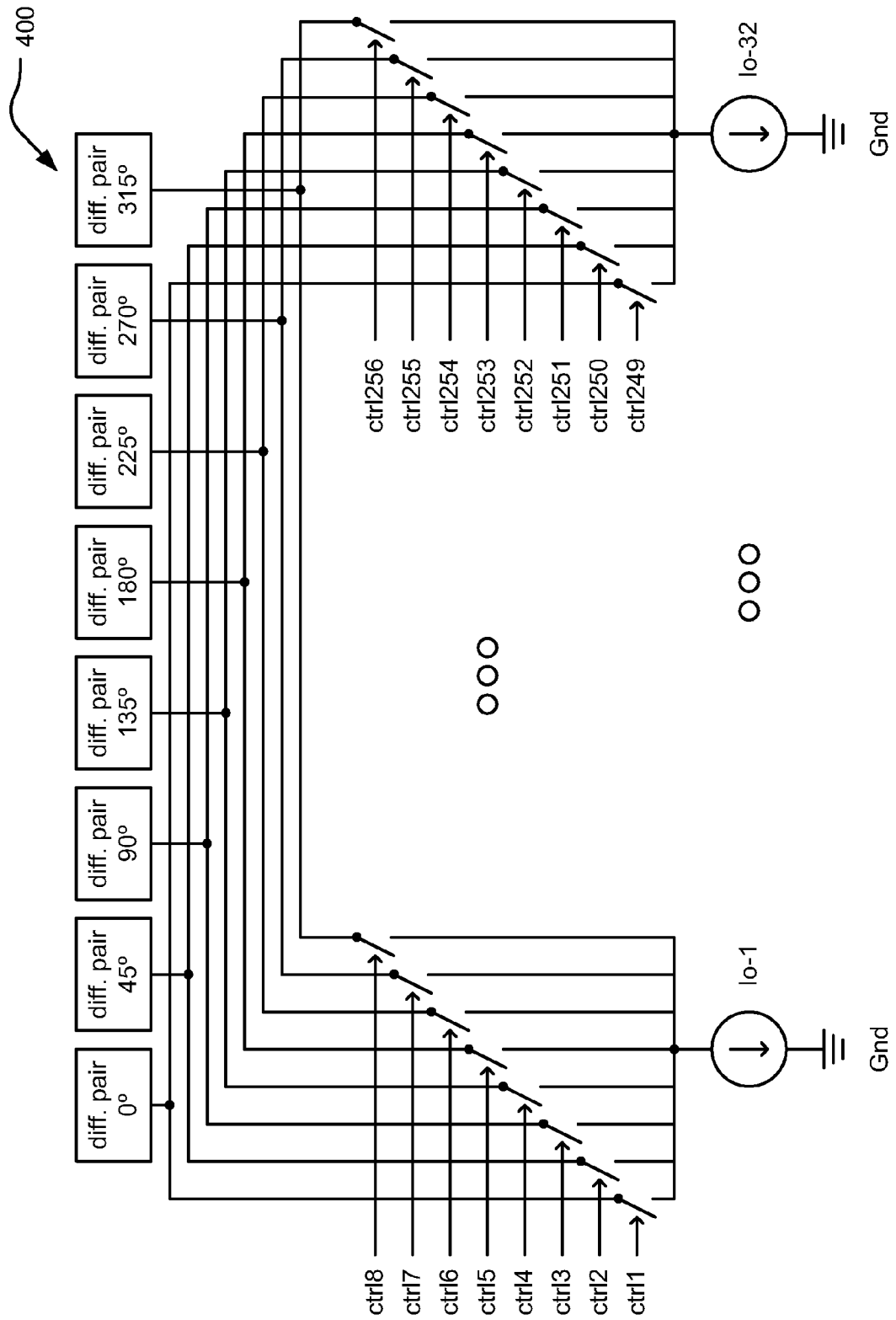
FIG. 4 illustrates an alternative embodiment of a prior art apparatus implemented to perform phase rotation.

For more detailed description of the prior art embodiments of FIG. 2, FIG. 3, and FIG. 4, the reader is directed to the "DESCRIPTION OF RELATED ART" section herein.

FIG. 2 illustrates an embodiment of a prior art apparatus 200 implemented to perform phase rotation.

FIG. 3 illustrates an alternative embodiment of a prior art apparatus 300 implemented to perform phase rotation.

FIG. 4 illustrates an alternative embodiment of a prior art apparatus 400 implemented to perform phase rotation.

Figure 5:
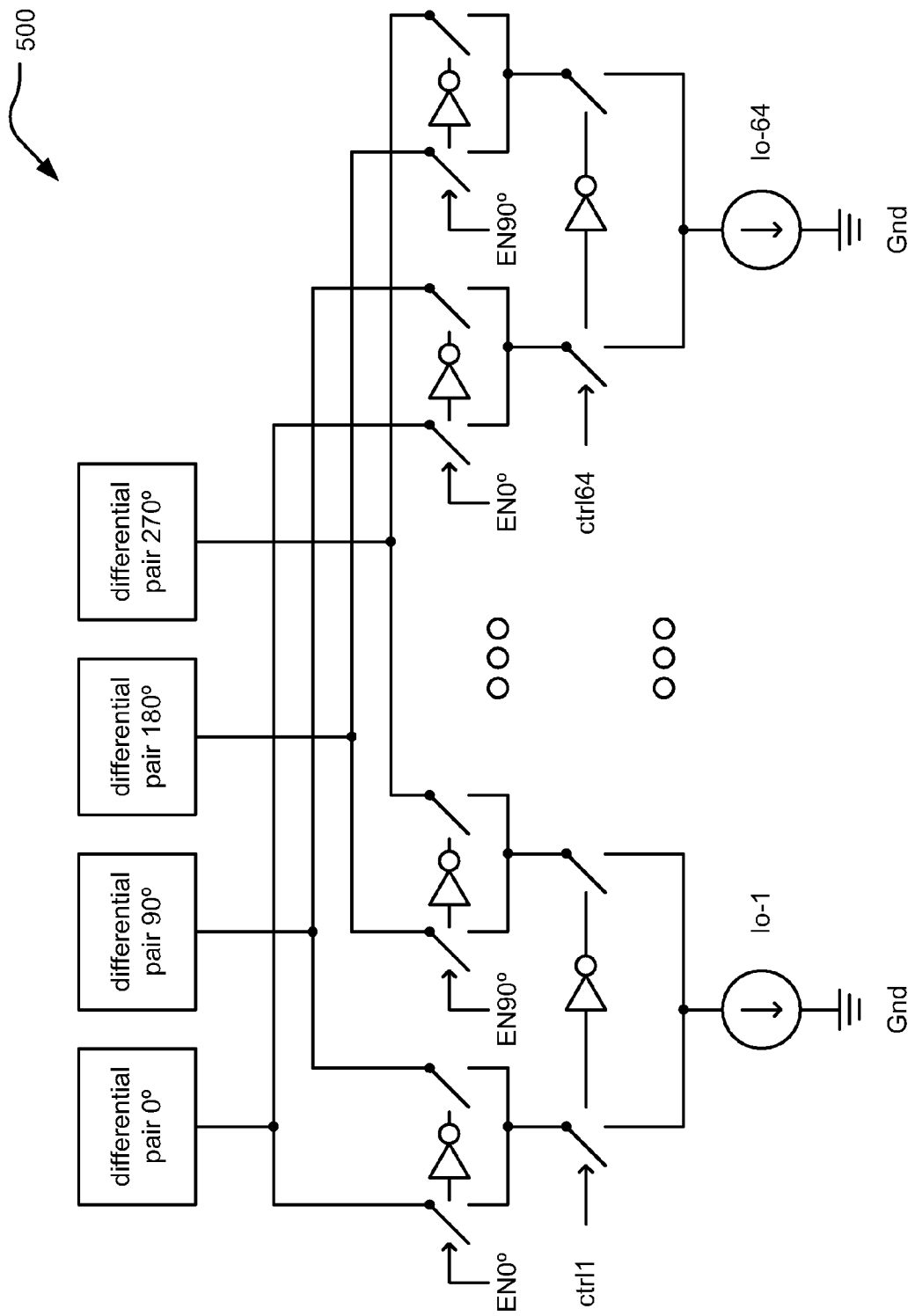
FIG. 5 illustrates an embodiment of an apparatus implemented to perform phase rotation.

FIG. 5 illustrates an embodiment of an apparatus 500 implemented to perform phase rotation. This embodiment includes a number of differential pairs of transistors implemented such that the gates of each differential pair receive one corresponding clock signal. Specifically, clock signals are provided to 4 different differential pairs of transistors, as shown by differential pair 0°, differential pair 90°, differential pair 180°, and differential pair 270°.

For example, a first clock signal having a phase of 0° is provided to differential pair 0°, a second clock signal having a phase of 90° is provided to differential pair 90°, a third clock signal having a phase of 180° is provided to differential pair 180°, and a fourth clock signal having a phase of 270° is provided to differential pair 270°.

This embodiment is depicted using 64 separate current sources and/or supplies (shown as Io-1 to Io-64), and each current supply is coupled to ends of 2 switches.

A first plurality of switches receives a first plurality of control signal that includes EN0° and EN90°. These control signals select a sector within a range (e.g., the range from 0° to 360° is divided into a number of sectors). Generally, this range from 0° to 360° is uniformly divided so that each sector is the same. In this particular embodiment, the range from 0° to 360° is evenly divided into 4 sectors or quadrants.

As can be seen when considering one instantiation of the control signal EN0°, it will close only one of the switches on either side of the inverter corresponding to the control signal EN0°. For example, current will flow through only one of the switches on either side of that corresponding inverter.

A second plurality of switches receives a second plurality of control signal that includes ctrl1, ctrl2, up to ctrl64. As can be seen when considering the ctrl1 signal, it will close only one of the switches on either side of the inverter that correspond to the current source Io-1. For example, current will flow from the current source Io-1 through only one of the switches on either side of that corresponding inverter.

Analogously, as can be seen when considering the ctrl64 signal, it will close only one of the switches on either side of the inverter that correspond to the current source Io-64. For example, current will flow from the current source Io-64 through only one of the switches on either side of that corresponding inverter.

As can be seen, this embodiment includes only N/4+2 inputs or control signals (where N is the number of control input signals employed in the prior art approach of FIG. 2). In addition, the multiplexing is done in the current domain in this novel embodiment.

Again, 4 separate clock signals are provided to the 4 different differential pairs of transistors, as shown by differential pair 0°, differential pair 90°, differential pair 180°, and differential pair 270°.

The first plurality of control signals can include 2 quadrant bits that are used to steer the phase rotator current to the appropriate differential pairs of transistors while the second plurality of control signals (e.g., N/4 bits, where N is the number of control input signals employed in the prior art approach of FIG. 2) operates to interpolate between phases of the clock signals provided to the selected differential pairs of transistors indicated by the first plurality of control signals (e.g., the 2 quadrant bits).

Considering one possible embodiment, in the case of 10 G analog to digital converter (ADC) used in multi-mode fiber (MMF) core, 5 phase rotators are used. Since the required phase step resolution is 1.6 pico-seconds (ps) and 2.5 Giga-Hertz (GHz) clock (where the period, T=400 ps) is used, the phase rotator requires 256 steps. Using a conventional/prior art approach (e.g., as in FIG. 2) leads to a total of 1280(=256× 5) control signals from the digital to analog core. To meet such a latency requirement within this MMF embodiment, these 1280 signals need to toggle at a rate of 300 Mega-Hertz (MHz). The routing required with so many high speed signals from a digital section of a device to the analog core of the device or another device is a significant design challenge. In addition, such extensive routing and signaling can be very power and energy consumptive within a device. Using the novel design approach presented herein for such an MMF application, only 330 (=66×5) signals would be required compared to 1280 (=256×5) using the prior art approach.

Considering an embodiment including only one phase rotator (vs. the 5 phase rotator embodiment described just above) and comparing the novel apparatus 500 of FIG. 5 to the prior art apparatus 200 of FIG. 2 or the prior art apparatus 300 of FIG. 3, it can be seen that only 66 control signals are required in the apparatus 500 as compared to the 256 control signals of the apparatus 200 or the apparatus 300. For example, considering the apparatus 500 that employs 64 current sources, 64 control signals are employed to steer current appropriately, and only 2 control signals employed to indicate which quadrant the desired phase is in. This can be considered as reducing the required number of switches from 256 to only 66.

Figure 6:
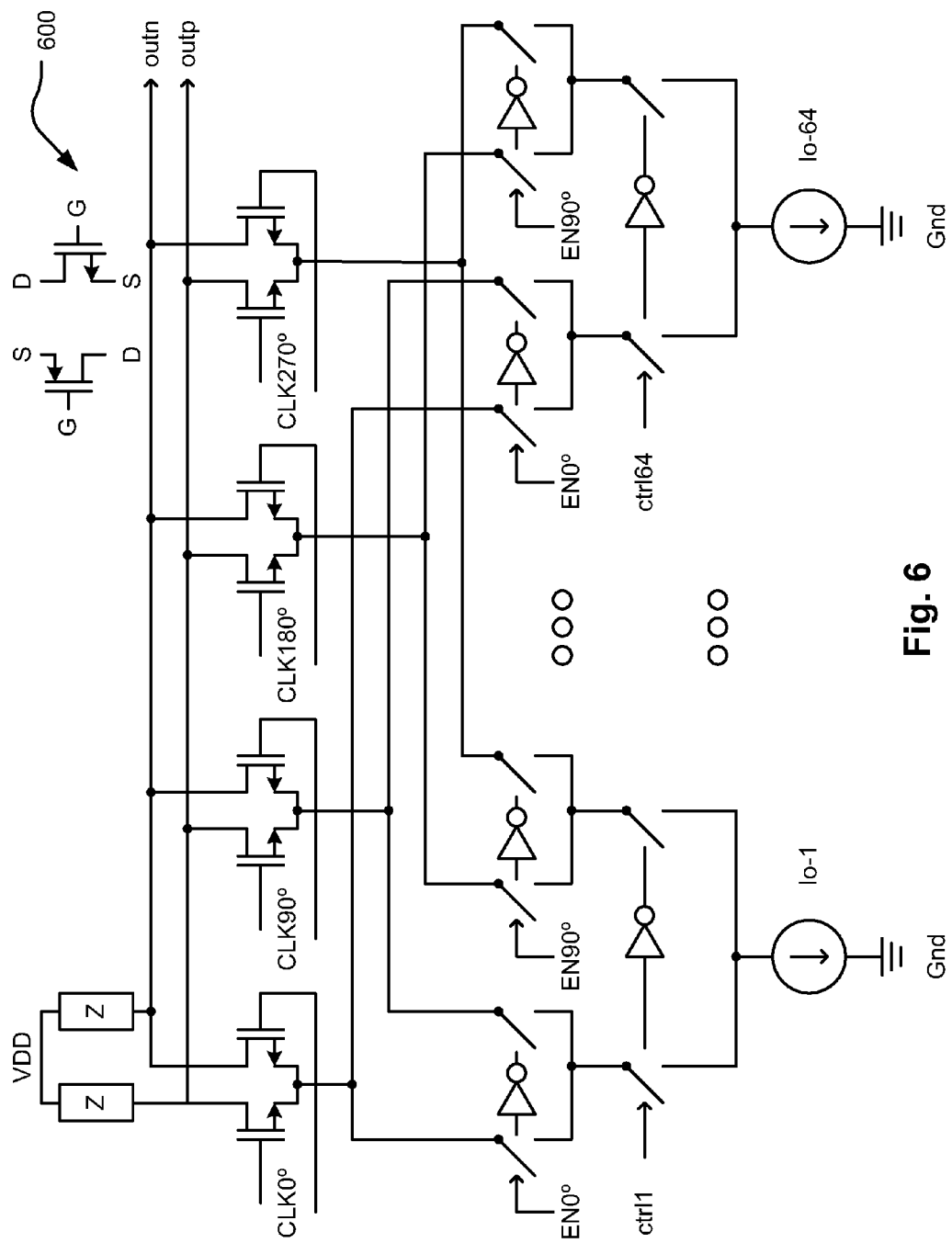
FIG. 6 illustrates an alternative embodiment of an apparatus implemented to perform phase rotation.

FIG. 6 illustrates an alternative embodiment of an apparatus 600 implemented to perform phase rotation. This embodiment 600 is analogous to the previous embodiment, and this embodiment shows the connectivity of the differential pairs of transistors and how the various clock signals are provided to their respective gates. For example, a first clock signal having a phase of 0° is provided to differential pair 0°, a second clock signal having a phase of 90° is provided to differential pair 90°, a third clock signal having a phase of 180° is provided to differential pair 180°, and a fourth clock signal having a phase of 270° is provided to differential pair 270°.

The sources of each differential pair are coupled together and that node is also coupled to one switch controlled by control signal EN0° within each of the 64 switch groups that correspond to the 64 separate current sources and/or supplies (shown as Io-1 to Io-64).

For example, the sources of the differential pair 0° are coupled together and that node is coupled to the switches controlled by control signal EN0°. The sources of the differential pair 90° are coupled together and that node is coupled to the switches located on the other side of the inverters whose input is the control signal EN0°. The sources of the differential pair 180° are coupled together and that node is coupled to the switches controlled by control signal EN90°. The sources of the differential pair 270° are coupled together and that node is coupled to the switches located on the other side of the inverters whose input is the control signal EN90°.

When the control signal EN0° closes the switches on the left hand side of the inverters whose input is the control signal EN0°, the switches on the right hand side of those inverters will be open. Similarly, when the control signal EN90° closes the switches on the left hand side of the inverters whose input is the control signal EN90°, the switches on the right hand side of those inverters will be open.

Similarly, when the control signal ctrl1 closes the switches on the left hand side of the inverters whose input is the control signal ctrl1, the switches on the right hand side of those inverters will be open. This is similar for all of the control signals ctrl2 though ctrl64.

The control signal EN0° and the control signal EN90° select which quadrant is employed and then direct current to one or at most two sets of the differential pairs of transistors.

The control signal EN0° and the control signal EN90° can direct current to the to differential pair 0°, the differential pair 90°, the differential pair 180°, the differential pair 270°, or some combination thereof.

When a phase is desired other than 0°, 90°, 180°, or 270°, then the control signals (ctrl1, ctrl2, ctrl3, and ctr64) direct current from the current sources Io-1 to Io-64 to two sets of the differential pairs of transistors.

When a phase between 0° and 90° is desired, then current from the current sources Io-1 to Io-64 is directed to the differential pair 0° and the differential pair 90° is a particular manner.

When a phase between 90° and 180° is desired, then current from the current sources Io-1 to Io-64 is directed to the differential pair 90° and the differential pair 180° is a particular manner.

When a phase between 180° and 270° is desired, then current from the current sources Io-1 to Io-64 is directed to the differential pair 180° and the differential pair 270° is a particular manner.

When a phase between 270° and 360° is desired, then current from the current sources Io-1 to Io-64 is directed to the differential pair 270° and the differential pair 0° is a particular manner.

More specifically, if all current from all of the current sources Io-1 to Io-64 is directed to the differential pair 0°, then the output signal (shown as outn/outp) has a phase of 0°. If all current from all of the current sources Io-1 to Io-64 is directed to the differential pair 90°, then the output signal (shown as outn/outp) has a phase of 90°.

If all current from all of the current sources Io-1 to Io-64 is directed to the differential pair 180°, then the output signal (shown as outn/outp) has a phase of 180°. If all current from all of the current sources Io-1 to Io-64 is directed to the differential pair 270°, then the output signal (shown as outn/outp) has a phase of 270°.

If the current from one half of the current sources (e.g., Io-1 to Io-32) is directed to the differential pair 0°, and the current from one half of the current sources (e.g., Io-33 to Io-64) is directed to the differential pair 90°, then the output signal (shown as outn/outp) has a phase of 45°.

Also, if three fourths of the current sources (e.g., Io-1 to Io-16) is directed to the differential pair 0°, and one fourth of the current sources (e.g., Io-17 to Io-64) is directed to the differential pair 90°, then the output signal (shown as outn/outp) has a phase of 22.5°.

By directing the current from the current sources (e.g., Io-1 to Io-64) to two different differential pairs of transistors in a particular manner, then a signal having any desired phase (as controlled by the limits of the step size of the device) in between the phases of the clock signals provided to those two different differential pairs of transistors can be generated and output via the selectively coupled drains of the differential pairs of transistors (as shown by outn/outp).

As can also be seen in this embodiment, load impedances (shown as Z) (e.g., which can be resistors, inductors, capacitors, transistors, other circuit elements, and/or any combination thereof) may be coupled between the selectively coupled drains of the differential pairs of transistors to a power supply voltage (e.g., VDD or VSS).

Although many of the diagrams depicted herein show n-channel metal oxide semiconductor field-effect transistor (N-MOSFET) based switches and differential pairs of transistors, it is noted that p-channel metal oxide semiconductor field-effect transistor (P-MOSFET) based switches and differential pairs of transistors may alternatively be employed without departing from the scope and spirit of the invention.

Figure 8:
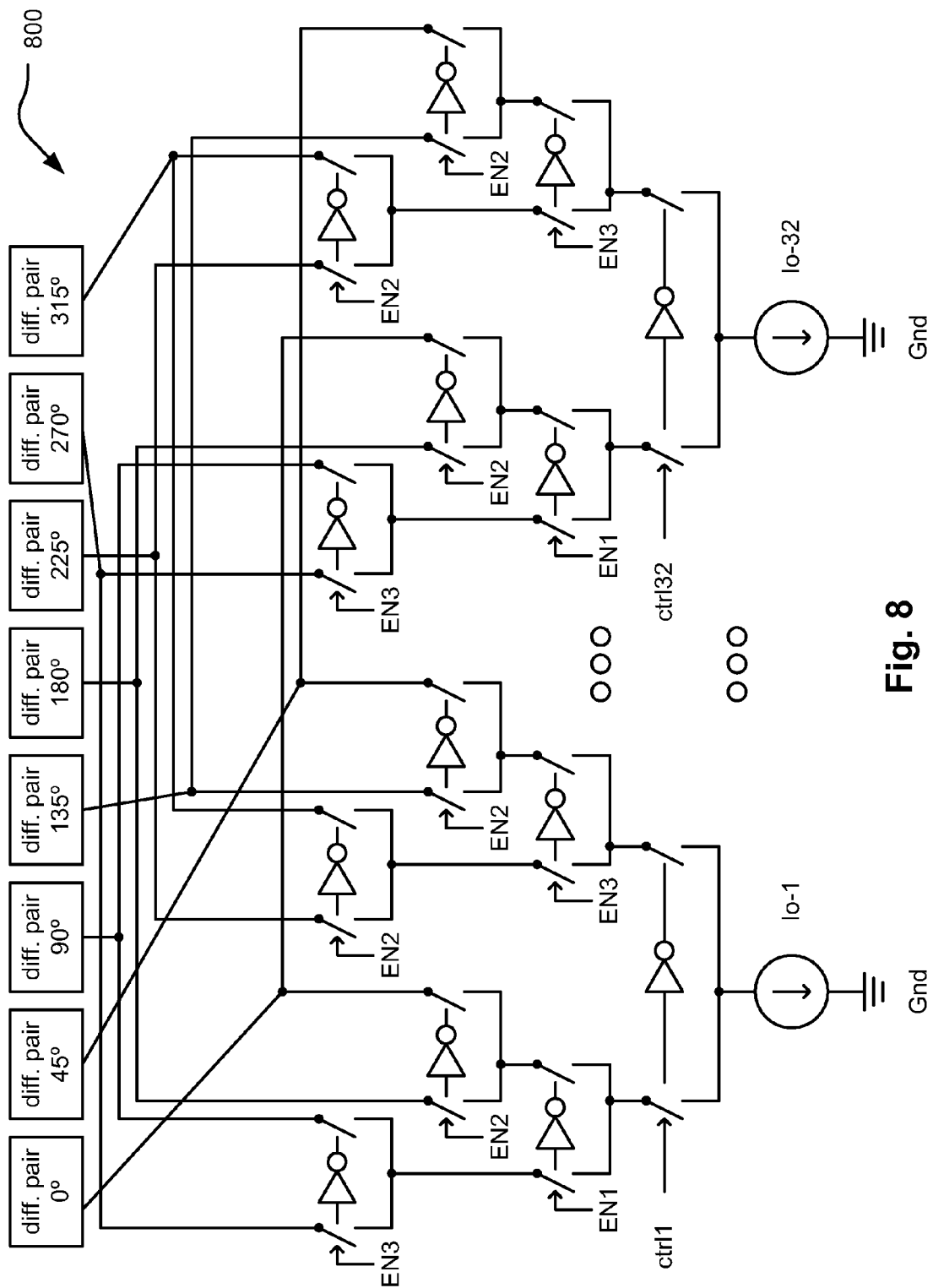
FIG. 8 illustrates an alternative embodiment of an apparatus implemented to perform phase rotation.
Figure 9:
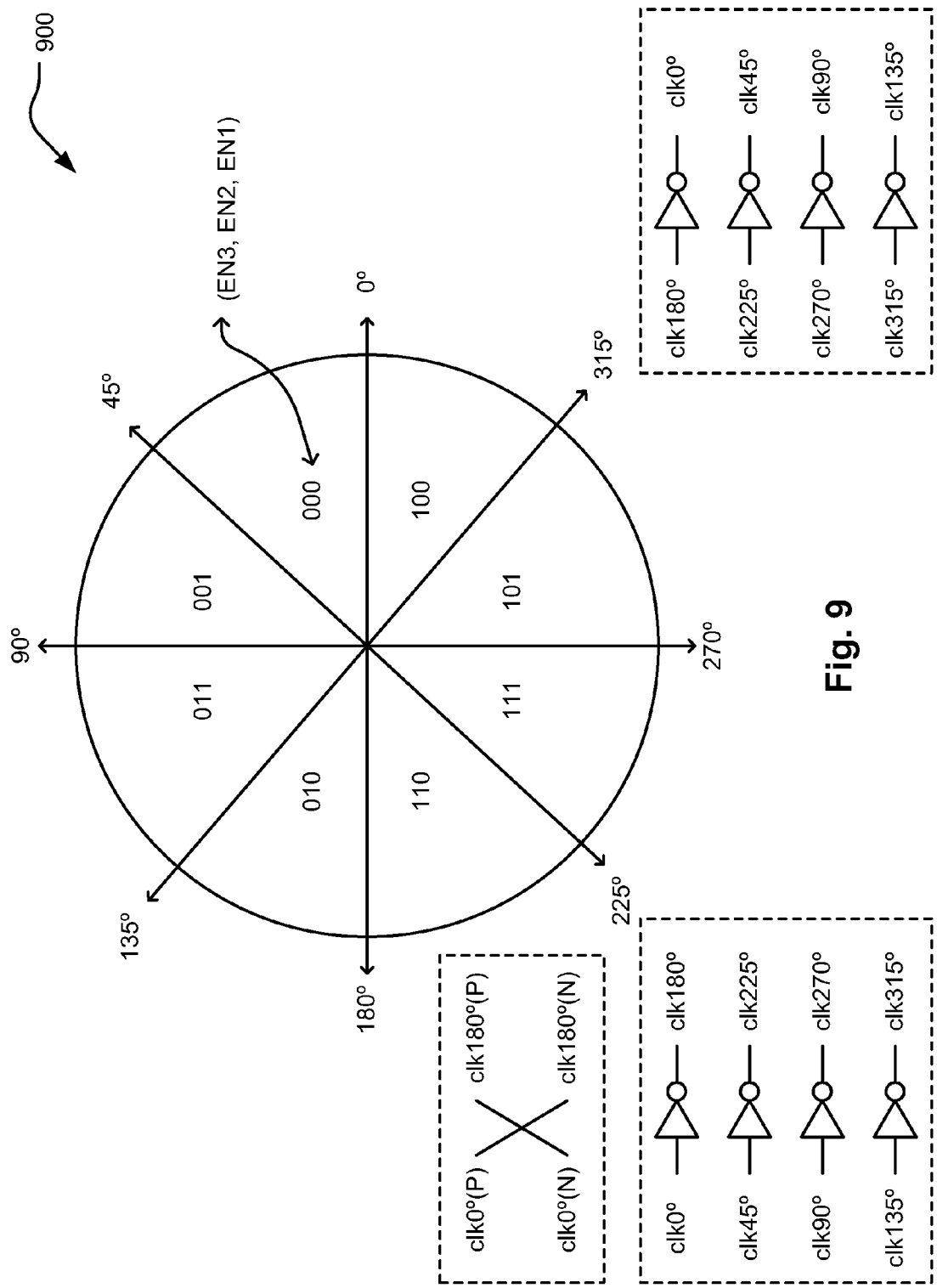
FIG. 9 illustrates an embodiment of control signal correspondence to 8 sectors.

In addition, this technique can be used with more than 4 input phases are used for interpolation as depicted in some of the other embodiments (e.g., FIG. 8 and FIG. 9). In addition, different numbers of current supplies, different number of sectors, and other variations may be employed in accordance with certain aspects of the invention as well.

Figure 7:
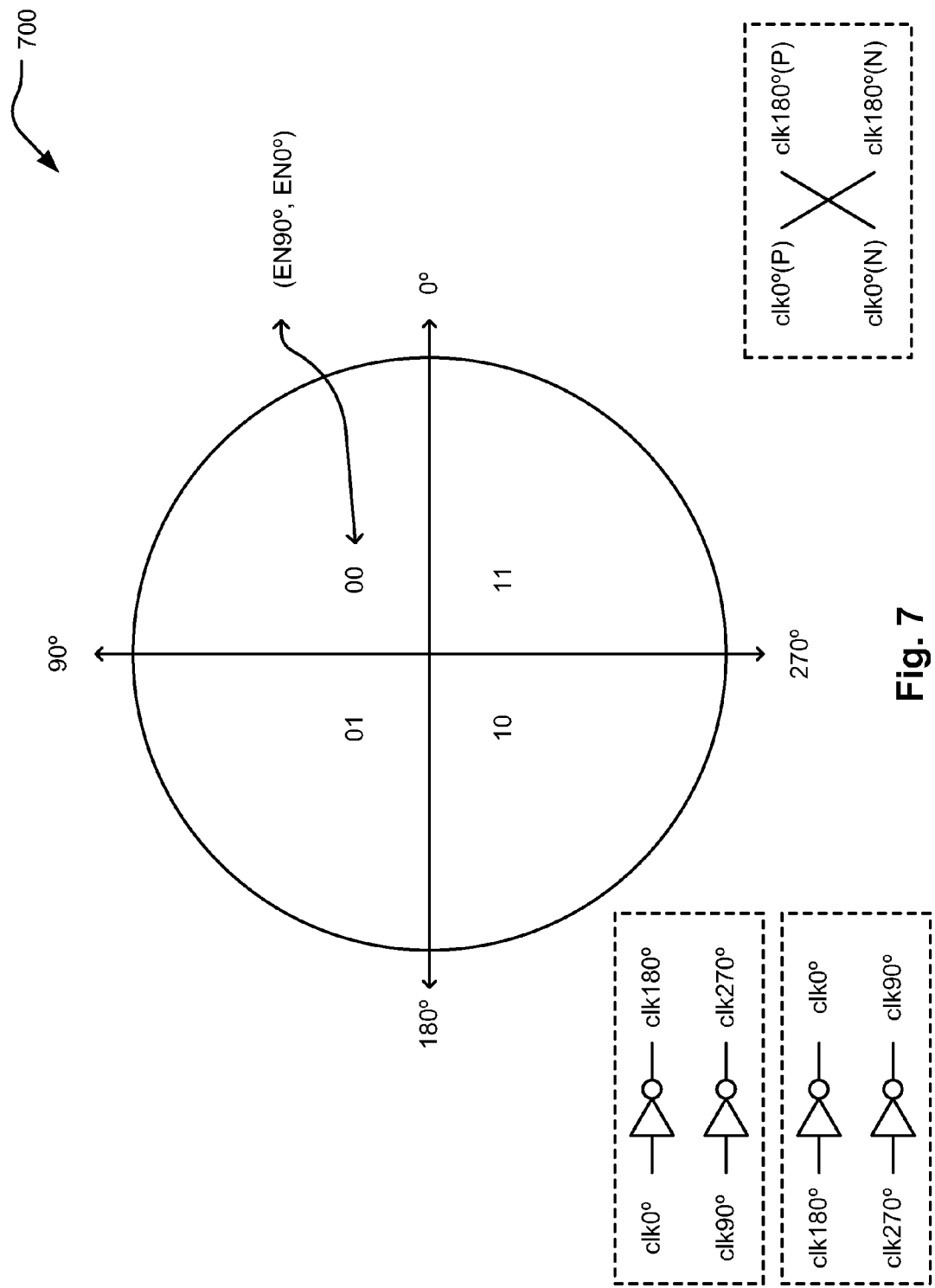
FIG. 7 illustrates an embodiment of control signal correspondence to 4 sector or quadrants.

FIG. 7 illustrates an embodiment of control signal correspondence to 4 sector or quadrants 700. The control signal EN0° and the control signal EN90° select which quadrant is employed and then direct current to one or at most two sets of the differential pairs of transistors. For example, if the control signal EN0° and the control signal EN90° are 00, then the first quadrant between 0° and 90° is selected. As can be seen, other of the sectors can be selected as well. If the control signal EN0° and the control signal EN90° are 10, then the third quadrant between 180° and 170° is selected.

In some embodiments, it is noted that only one half of the needed clock signals need be received, and the remaining of the clock signals can be generated using those firstly received clock signals. For example, if only clock signals having phases 0° and 90° are received, then each of those clock signals can be inverted to generate the clock signals having phases 180° and 270°, respectively. Considering an embodiment employing differential clock signals, the polarity of a differential clock signal having phase 0° needs only to be switched to generate a differential clock signal having phase 180°. Also, the polarity of a differential clock signal having phase 90° needs only to be switched to generate a differential clock signal having phase 270°.

FIG. 8 illustrates an alternative embodiment of an apparatus 800 implemented to perform phase rotation. This embodiment is somewhat analogous to the previous embodiment of FIG. 5, except this embodiment includes 8 differential pairs of transistors, and the range between 0° and 360° is divided into 8 sectors. This functionality can be extended to include more or less than 8 differential pairs of transistors, and the range between 0° and 360° can alternatively be divided into more or less than sectors.

For example, 8 different clock signals are provided to the 8 differential pairs of transistors. A clock signal having a phase of 0° is provided to differential pair 0°, a clock signal having a phase of 45° is provided to differential pair 45°, a clock signal having a phase of 90° is provided to differential pair 90°, a clock signal having a phase of 135° is provided to differential pair 135°, a clock signal having a phase of 180° is provided to differential pair 180°, a clock signal having a phase of 225° is provided to differential pair 225°, a clock signal having a phase of 270° is provided to differential pair 270°, and a clock signal having a phase of 315° is provided to differential pair 315°.

Again, in some embodiments, it is noted that only one half of the needed clock signals need be receives, and the remaining of the clock signals can be generated using those firstly received clock signals. For example, if only clock signals having phases 0°, 45°, 90° and 135° are received, then each of those clock signals can be inverted to generate the clock signals having phases 180°, 225°, 270° and 310°, respectively. Considering an embodiment employing differential clock signals, the polarity of a differential clock signal having phase 0° needs only to be switched to generate a differential clock signal having phase 180°. Also, the polarity of a differential clock signal having phase 45° needs only to be switched to generate a differential clock signal having phase 225°. Similarly, switching the polarity of a differential clock signal having phase 90° generates a differential clock signal having phase 270°, and switching the polarity of a differential clock signal having phase 135° generates a differential clock signal having phase 315°.

As can be seen, based on the control signals EN1, EN2, and EN3, current to directed from the 32 current sources Io-1 to Io-32 to one or at most two sets of the differential pairs of transistors.

More specifically, the control signals EN1, EN2, and EN3 can direct current to the to differential pair 0°, the differential pair 45°, the differential pair 90°, the differential pair 135°, differential pair 180°, the differential pair 225°, the differential pair 270°, the differential pair 315°, or some combination thereof.

When a phase is desired other than 0°, 45°, 90°, 135°, 180°, 225°, 270°, or 315°, then the control signals (ctrl1, ctrl2, ctrl3, and ctr32) direct current from the current sources Io-1 to Io-32 to two sets of the differential pairs of transistors.

When a phase between 0° and 45° is desired, then current from the current sources Io-1 to Io-32 is directed to the differential pair 0° and the differential pair 45° is a particular manner.

When a phase between 45° and 90° is desired, then current from the current sources Io-1 to Io-32 is directed to the differential pair 45° and the differential pair 90° is a particular manner.

When a phase between 90° and 135° is desired, then current from the current sources Io-1 to Io-64 is directed to the differential pair 90° and the differential pair 135° is a particular manner.

More specifically, if all current from all of the current sources Io-1 to Io-32 is directed to the differential pair 0°, then an output signal has a phase of 0°. If all current from all of the current sources Io-1 to Io-32 is directed to the differential pair 45°, then the output signal (shown as outn/outp) has a phase of 45°.

If the current from one half of the current sources (e.g., Io-1 to Io-16) is directed to the differential pair 0°, and the current from one half of the current sources (e.g., Io-17 to Io-32) is directed to the differential pair 45°, then the output signal (shown as outn/outp) has a phase of 22.5°.

It is noted that an even larger number of clocks having different phases could also be employed without departing from the scope and spirit of the invention. Generally speaking, as the number of clock signals increases, the number of current sources required is reduced while maintaining a comparable step size.

FIG. 9 illustrates an embodiment of control signal correspondence to 8 sectors 900. The control signals EN1, EN2, and EN3 select which sector is employed and then direct current to one or at most two sets of the differential pairs of transistors. For example, if the control signals EN3, EN2, and EN1 are 000, then the first quadrant between 0° and 45° is selected. As can be seen, other of the sectors can be selected as well. If the control signals EN3, EN2, and EN1 are 110, then the fifth quadrant between 180° and 225° is selected.

Considering the diagrams of FIG. 7 and FIG. 9, it is further noted that, when the range from 0° to 360° is uniformly divided into $2^m$ sectors (where m is an integer), then $2^m$ clock signals are also employed. Also, m bits are then needed to indicate which sector is being employed in a given embodiment. Looking at a particular example, if the range from 0° to 360° is uniformly divided into $4=2^2=2^m$ sectors or quadrants (where m=2), then $4=2^2=2^m$ clock signals are used, and m=2 bits are employed to indicate which sector is being employed (which then indicates which two clock signals of the $4=2^2=2^m$ clock signals are used to generate a given output signal).

If the range from 0° to 360° is uniformly divided into $8=2^3=2^m$ sectors (where m=3), then $8=2^3=2^m$ clock signals are used, and m=3 bits are employed to indicate which sector is being employed (which then indicates which two clock signals of the $8=2^3=2^m$ clock signals are used to generate a given output signal). If the range from 0° to 360° is uniformly divided into $16=2^4=2^m$ sectors (where m=4), then $16=2^4=2^m$ clock signals are used, and m=4 bits are employed to indicate which sector is being employed (which then indicates which two clock signals of the $16=2^4=2^m$ clock signals are used to generate a given output signal), and so on.

Figure 10:
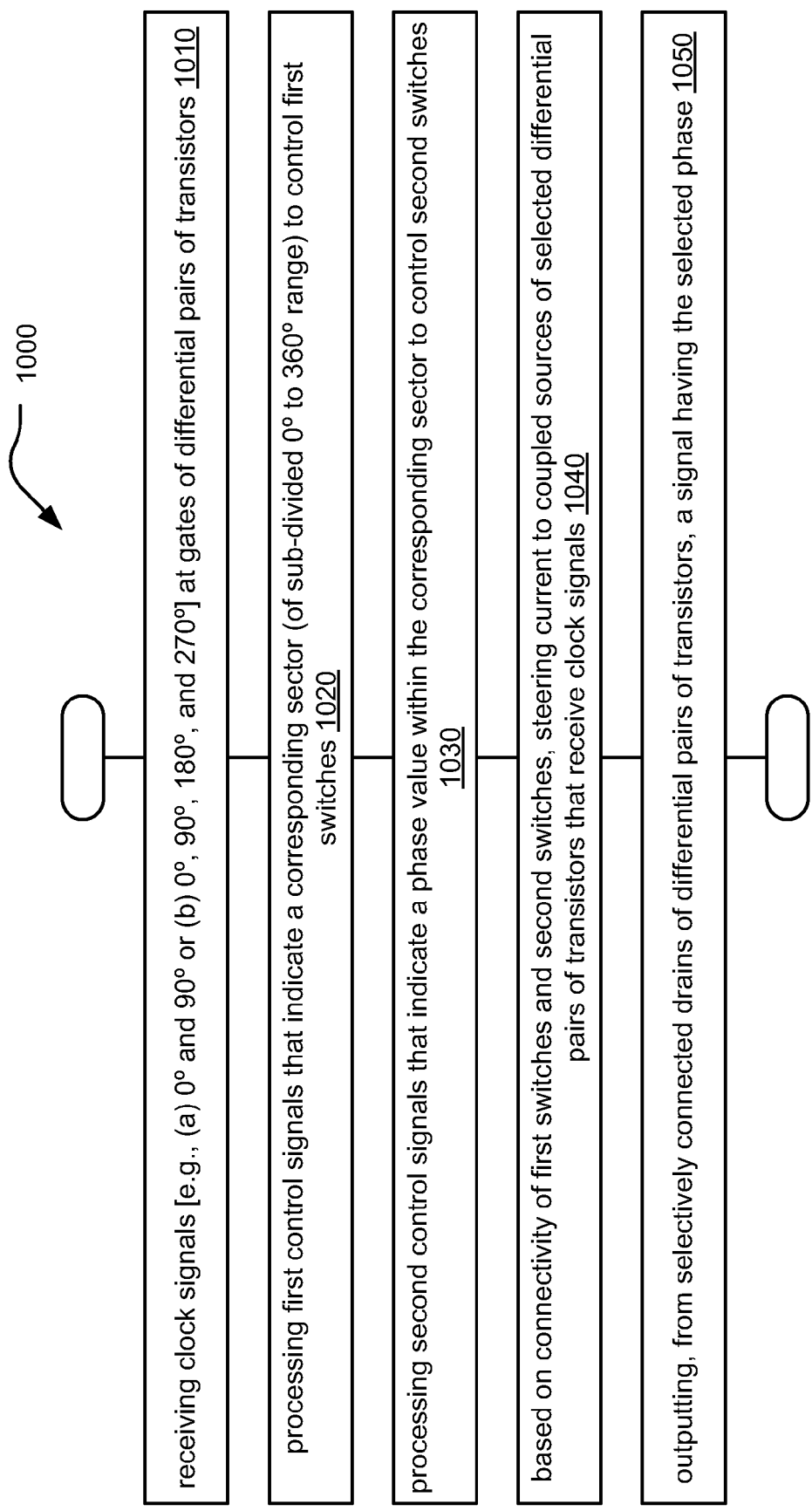
FIG. 10 illustrates an embodiment of a method that generates a phase rotated signal.

FIG. 10 illustrates an embodiment of a method 1000 that generates a phase rotated signal. The method 1000 begins by receiving clock signals [e.g., (a) 0° and 90° or (b) 0°, 90°, 180°, and 270°] at gates of differential pairs of transistors, as shown in a block 1010. For example, if only clock signals having phases 0° and 90° are received, then each of those clock signals can be inverted to generate the clock signals having phases 180° and 270°, respectively. Considering an embodiment employing differential clock signals, the polarity of a differential clock signal having phase 0° needs only to be switched to generate a differential clock signal having phase 180°. Also, the polarity of a differential clock signal having phase 90° needs only to be switched to generate a differential clock signal having phase 270°.

Alternatively, if more a range between 0° and 360° is divided into more than 4 sectors, and/or if more than 4 differential pairs of transistors are employed, then more than 4 clock signals may be employed.

The method 1000 continues by processing first control signals that indicate a corresponding sector (of sub-divided 0° to 360° range) to control first switches, as shown in a block 1020. The method 1000 continues by processing second control signals that indicate a phase value within the corresponding sector to control second switches, as shown in a block 1030. The second control signals select one of the phases within the selected sector.

The method 1000 continues by based on connectivity of first switches and second switches, steering current to sources of selected differential pairs of transistors that receive clock signals, as shown in a block 1040. The method 1000 continues by outputting, from selectively connected drains of the differential pairs of transistors, a signal having selected phase, as shown in a block 1050.

It is noted that the various modules (e.g., encoders, decoders, phase rotators, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
a plurality of differential pairs of transistors implemented to receive a plurality of clock signals, wherein:
each clock signal of the plurality of clock signals is provided to gates of one differential pair of the plurality of differential pairs of transistors; and
sources of each differential pair of the plurality of differential pairs of transistors are coupled together;
a first plurality of switches, controlled by a first plurality of control signals including a first control signal and a second control signal, such that a first subset of the first plurality of switches is controlled by the first control signal, a second subset of the first plurality of switches is controlled by the second control signal, a third subset of the first plurality of switches is controlled by an inversion of the first control signal, and a fourth subset of the first plurality of switches is controlled by an inversion of the second control signal, implemented to select a sector by employing the first plurality of control signals, wherein a range between 0 degrees and 360 degrees is sub-divided into a plurality of sectors such that each sector includes a plurality of possible phases between that sector's uppermost phase and that sector's lowermost phase, inclusive;

a second plurality of switches, controlled by a second plurality of control signals, implemented to select a phase of an output signal such that the selected phase is within the selected sector;

a plurality of current sources implemented selectively to steer current to coupled sources of selected differential pairs of transistors of the plurality of differential pairs of transistors based on connectivity of the first plurality of switches and the second plurality of switches; and an output signal having the selected phase is output from coupled drains of the plurality of differential pairs of transistors, wherein the selected phase is included within the selected sector.

2. The apparatus of claim 1, further comprising:
an input that receives an input clock signal; and wherein:
the input clock signal is processed by switching a polarity of the input clock signal to generate at least one clock signal of the plurality of clock signals.

3. The apparatus of claim 1, wherein:
phase values the plurality of clock signals are evenly distributed between 0 degrees and 360 degrees; and
a phase difference between a first clock signal and a second clock signal of the plurality of clock signals is same as a phase difference between the second clock signal and a clock third signal of the plurality of clock signals.

4. The apparatus of claim 1, wherein:
the plurality of clock signals is a plurality of differential signals.

5. The apparatus of claim 1, wherein:
the plurality of differential pairs of transistors is a plurality of n-channel metal oxide semiconductor field-effect transistors (N-MOSFETs).

6. The apparatus of claim 1, wherein:
a first subset of current sources of the plurality of current sources steers current to coupled sources of a first subset of the selected differential pairs of transistors; and
a second subset of current sources of the plurality of current sources steers current to coupled sources of a second subset of the selected differential pairs of transistors.

7. The apparatus of claim 1, wherein:
each control signal of the first plurality of control signals is a one bit signal; and
each control signal of the second plurality of control signals is a one bit signal.

8. The apparatus of claim 1, wherein:
the plurality of clock signals includes a first clock signal having a phase value of 0 degrees, a second clock signal having a phase value of 90 degrees, a third clock signal having a phase value of 180 degrees, and a fourth clock signal having a phase value of 270 degrees; and
the range between 0 degrees and 360 degrees is divided into 4 sectors or 4 quadrants.

9. The apparatus of claim 1, wherein:
the range between 0 degrees and 360 degrees is divided into $2^m$ sectors;
the plurality of clock signals includes $2^m$ clock signals;
the apparatus employs m bits to indicate which sector of the $2^m$ sectors is the selected sector; and
m is an integer.

10. The apparatus of claim 1, wherein:
the apparatus is a circuitry that is implemented within a communication device; and
the communication device is implemented within at least one of a satellite communication system, a wireless communication system, a wired communication system, and a fiber-optic communication system.

11. An apparatus, comprising:
an input that receives an input clock signal, wherein the input clock signal is processed by switching a polarity of the input clock signal to generate at least one clock signal of a plurality of clock signals;

a plurality of differential pairs of transistors implemented to receive the plurality of clock signals, wherein:
each clock signal of the plurality of clock signals is provided to gates of one differential pair of the plurality of differential pairs of transistors; and
sources of each differential pair of the plurality of differential pairs of transistors are coupled together;

a first plurality of switches, controlled by a first plurality of control signals including a first control signal and a second control signal, such that a first subset of the first plurality of switches is controlled by the first control signal, a second subset of the first plurality of switches is controlled by the second control signal, a third subset of the first plurality of switches is controlled by an inversion of the first control signal, and a fourth subset of the first plurality of switches is controlled by an inversion of the second control signal, implemented to select a sector by employing the first plurality of control signals, wherein a range between 0-degrees and 360 degrees i is sub-divided into a plurality of sectors such that each sector includes a plurality of possible phases between that sector's uppermost phase and that sector's lowermost phase, inclusive;

a second plurality of switches, controlled by a second plurality of control signals, implemented to select a phase of an output signal such that the selected phase is within the selected sector;

a plurality of current sources implemented selectively to steer current to coupled sources of selected differential pairs of transistors of the plurality of differential pairs of transistors based on connectivity of the first plurality of switches and the second plurality of switches; and an output signal having the selected phase is output from coupled drains of the plurality of differential pairs of transistors; and wherein:

the selected phase is included within the selected sector;
phase values the plurality of clock signals are evenly distributed between 0 degrees and 360 degrees; and
a phase difference between a first clock signal and a second clock signal of the plurality of clock signals is same as a phase difference between the second clock signal and a clock third signal of the plurality of clock signals.

12. The apparatus of claim 11, wherein:
the plurality of differential pairs of transistors is a plurality of n-channel metal oxide semiconductor field-effect transistors (N-MOSFETs).

13. The apparatus of claim 11, wherein:
each control signal of the first plurality of control signals is a one bit signal; and
each control signal of the second plurality of control signals is a one bit signal.

14. The apparatus of claim 11, wherein:
the plurality of clock signals includes a first clock signal having a phase value of 0 degrees, a second clock signal having a phase value of 90 degrees, a third clock signal having a phase value of 180 degrees, and a fourth clock signal having a phase value of 270 degrees; and the range between 0 degrees and 360 degrees is divided into 4 sectors or 4 quadrants.

15. The apparatus of claim 11, wherein:

the range between 0 degrees and 360 degrees is divided into $2^m$ sectors;

the plurality of clock signals includes $2^m$ clock signals;

the apparatus employs m bits to indicate which sector of the $2^m$ sectors is the selected sector; and m is an integer.

16. The apparatus of claim 11, wherein:

the apparatus is a circuitry that is implemented within a communication device; and the communication device is implemented within at least one of a satellite communication system, a wireless communication system, a wired communication system, and a fiber-optic communication system.

17. An apparatus, comprising:

a plurality of differential pairs of transistors implemented to receive a plurality of clock signals, wherein:

each clock signal of the plurality of clock signals is provided to gates of one differential pair of the plurality of differential pairs of transistors; and sources of each differential pair of the plurality of differential pairs of transistors are coupled together;

a first plurality of switches, controlled by a first plurality of control signals including a first control signal and a second control signal, such that a first subset of the first plurality of switches is controlled by the first control signal, a second subset of the first plurality of switches is controlled by the second control signal, a third subset of the first plurality of switches is controlled by an inversion of the first control signal, and a fourth subset of the first plurality of switches is controlled by an inversion of the second control signal, implemented to select a sector by employing the first plurality of control signals, wherein a range between 0 degrees and 360 degrees i is sub-divided into a plurality of sectors such that each sector includes a plurality of possible phases between that sector's uppermost phase and that sector's lowermost phase, inclusive;

a second plurality of switches, controlled by a second plurality of control signals, implemented to select a phase of an output signal such that the selected phase is within the selected sector;

a plurality of current sources implemented selectively to steer current to coupled sources of selected differential pairs of transistors of the plurality of differential pairs of transistors based on connectivity of the first plurality of switches and the second plurality of switches; and an output signal having the selected phase is output from coupled drains of the plurality of differential pairs of transistors; and wherein:

the selected phase is included within the selected sector;

a first subset of current sources of the plurality of current sources steers current to coupled sources of a first subset of the selected differential pairs of transistors;

a second subset of current sources of the plurality of current sources steers current to coupled sources of a second subset of the selected differential pairs of transistors;

each control signal of the first plurality of control signals is a one bit signal; and each control signal of the second plurality of control signals is a one bit signal.

18. The apparatus of claim 17, wherein:

the range between 0 degrees and 360 degrees is divided into $2^m$ sectors;

the plurality of clock signals includes $2^m$ clock signals;

the apparatus employs m bits to indicate which sector of the $2^m$ sectors is the selected sector; and m is an integer.

19. The apparatus of claim 17, wherein:

the plurality of differential pairs of transistors is a plurality of n-channel metal oxide semiconductor field-effect transistors (N-MOSFETs).

20. The apparatus of claim 17, wherein:

the apparatus is a circuitry that is implemented within a communication device; and the communication device is implemented within at least one of a satellite communication system, a wireless communication system, a wired communication system, and a fiber-optic communication system.

* * * * *

UNITED STATES PATENT AND TRADEMARK OFFICE
CERTIFICATE OF CORRECTION

PATENT NO.         : 7,750,707 B2
APPLICATION NO.    : 12/049677
DATED              : July 6, 2010
INVENTOR(S)        : Afshin Momtaz It is certified that error appears in the above-identified patent and that said Letters Patent is hereby corrected as shown below:

Col. 13, line 34, in Claim 3: after "phase values", insert --of--
    Col. 13, line 29, in Claim 3: replace "clock third" with "third clock"
    Col. 14, line 28, in Claim 11: after "360 degrees" delete "i"
    Col. 14, line 47, in Claim 11: after "phase values", insert --of--
    Col. 14, line 52, in Claim 11: replace "clock third" with "third clock"
    Col. 15, line 38, in Claim 11: after "360 degrees" delete "i"

Signed and Sealed this
Twenty-seventh Day of March, 2012

David J. Kappos
*Director of the United States Patent and Trademark Office*